United States Patent
Ding

(10) Patent No.: US 11,196,029 B2
(45) Date of Patent: Dec. 7, 2021

(54) DISPLAY STRUCTURE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Feng Ding, Wuhan (CN)

( * ) Notice: Subject to any disclaimer, the term of this patent is extended or adjusted under 35 U.S.C. 154(b) by 328 days.

(21) Appl. No.: 16/333,237

(22) PCT Filed: Jan. 3, 2019

(86) PCT No.: PCT/CN2019/070214
§ 371 (c)(1),
(2) Date: Mar. 14, 2019

(87) PCT Pub. No.: WO2020/113752
PCT Pub. Date: Jun. 11, 2020

(65) Prior Publication Data
US 2021/0184181 A1   Jun. 17, 2021

(30) Foreign Application Priority Data
Dec. 5, 2018  (CN) .......................... 201811480988.0

(51) Int. Cl.
*H01L 51/56*  (2006.01)
*H01L 51/00*  (2006.01)

(52) U.S. Cl.
CPC .......... *H01L 51/56* (2013.01); *H01L 51/0097* (2013.01); *H01L 2251/5338* (2013.01)

(58) Field of Classification Search
None
See application file for complete search history.

(56) References Cited

U.S. PATENT DOCUMENTS 9,634,146 B2 * 4/2017 Hu ...................... H01L 27/1285
2015/0349185 A1 * 12/2015 Hsu ....................... H01L 31/108
257/26

(Continued)

FOREIGN PATENT DOCUMENTS

CN    104201283 A      12/2014
CN    104505467 A  *   4/2015

(Continued)

OTHER PUBLICATIONS

Delmdahl, Ralph, et al. "Laser Lift-off Systems for Flexible-Display Production." Journal of Information Display, vol. 15, No. 1, 2014, pp. 1-4., doi:10.1080/15980316.2014.881428. (Year: 2014).*

(Continued)

*Primary Examiner* — J. E. Schoenholtz

(57) ABSTRACT

A display structure and a manufacturing method thereof are provided. The manufacturing method including steps of: (a) providing a carrier sequentially including a rigid substrate, a sacrificial layer, and a graphene layer; (b) forming a flexible substrate on the carrier; (c) forming a display component layer on the flexible substrate; and (d) removing the rigid substrate and the sacrificial layer. By using the sacrificial layer and the graphene layer to prevent display structures from being damaged by a laser peeling off step and protect the flexible substrate during the manufacturing process, and increase the bendability of the flexible substrate.

13 Claims, 2 Drawing Sheets

(56) References Cited

U.S. PATENT DOCUMENTS

Figure 1A:
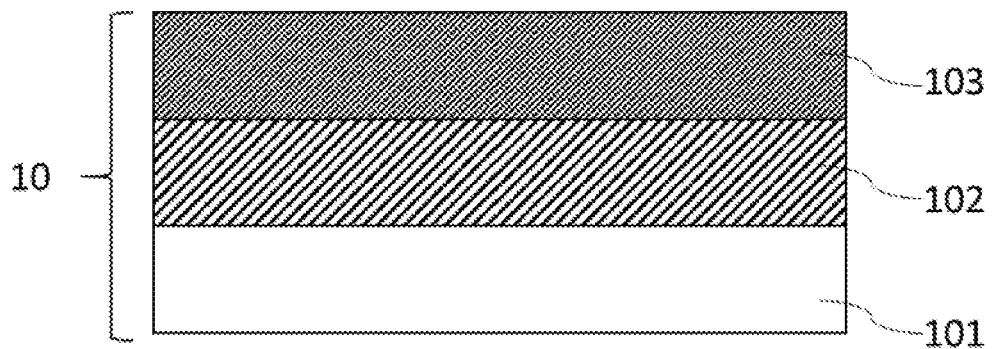

2017/0125136 A1 5/2017 Park et al.
2019/0324580 A1* 10/2019 Tanaka ................ H01L 27/3272

FOREIGN PATENT DOCUMENTS

| CN | 104505467 A | 4/2015 |
| CN | 106356472 A | 1/2017 |
| CN | 108054297 A | 5/2018 |

OTHER PUBLICATIONS

Park, Chan II, et al. "World's First Large Size 77-Inch Transparent Flexible OLED Display." Journal of the Society for Information Display, vol. 26, No. 5, 2018, pp. 287-295., doi:10.1002/jsid.663. (Year: 2018).*
Machine Translation of CN 104505467 (Year: 2015).*
Park, Chan II, et al. "World's First Large Size 77-lnch Transparent Flexible OLED Display." Journal of the Society for Information Display, vol. 26, No. 5, 2018, pp. 287-295., doi: 10.1002/jsid.663. (Year: 2018).*

* cited by examiner

DISPLAY STRUCTURE AND MANUFACTURING METHOD THEREOF

FIELD OF INVENTION

The present invention relates to a display structure and a manufacturing method thereof, and more particularly, to a flexible display structure and a manufacturing method thereof.

BACKGROUND OF INVENTION

In recent years, with the innovation and development of display technology, display application scenarios have become more diverse. Moreover, electronic products rapidly develop toward being light, thin, short, and small, demand for liquid crystal display panels used in various portable electronic products is increasing. Among them, flexible organic light emitting diodes (OLEDs) have characteristics such as self-luminescence, fast response times, wide viewing angles, etc., and have broad application prospects. Today, bendable displays are becoming mainstream.

Technical Problem

However, an existing structure of flexible organic light emitting diodes is that a flexible material (for example, polyimide) directly contacts with a glass substrate to form a flexible substrate, and the flexible substrate is peeled off from the glass substrate in a manufacturing process. A peeling step of the flexible substrate is to pyrolyze a contact surface between the flexible substrate and the glass substrate by using a laser, thereby achieving the peeling of the flexible substrate. After the flexible substrate is peeled off and before transferred to a next station, there is a risk of scratching, which may cause a negative impact during the subsequent bonding process, and leads to a reduction in yield. Moreover, using the laser to pyrolyze the contact surface between the flexible substrate and the glass substrate may damage display structures due to a high temperature of the laser. Furthermore, after the flexible substrate is pyrolyzed, the flexible substrate may not be able to completely separate from the glass substrate, so a part of the flexible substrate remains on the glass substrate, or a part of the flexible substrate after high temperature carbonization remains on the flexible substrate, which affects subsequent processes.

Therefore, it is necessary to provide a display structure and a manufacturing method thereof to solve the problems existing in the conventional art.

SUMMARY OF INVENTION

In view of the above, the present invention provides a display structure and a manufacturing method thereof, to solve a problem of the conventional art that display structures may be destroyed when a glass substrate is peeled off by using a laser.

A main object of the present invention is to provide a display structure and a manufacturing method thereof, which can improve a problem that display structures may be destroyed due to the high temperature of a laser when the laser is used to pyrolyze a contact surface between a flexible substrate and a glass substrate.

A secondary object of the present invention is to provide a display structure and a manufacturing method thereof, by using a sacrificial layer and a graphene layer, so that avoids damaging the display structures when flexible substrate uses the laser to peel off, and protects the flexible substrate during the manufacturing process, and increases the bendability of the flexible substrate.

In order to achieve the foregoing objects of the present invention, an embodiment of the present invention provides a manufacturing method of a flexible display, including steps of:

(a) providing a carrier sequentially including a rigid substrate, a sacrificial layer and a graphene layer;

(b) forming a flexible substrate on the carrier;

(c) forming a display component layer on the flexible substrate; and (d) applying a laser to the sacrificial layer, such that the sacrificial layer is completely pyrolyzed and vaporized by the laser without remaining on the rigid substrate, thereby removing the rigid substrate and the sacrifice layer.

In an embodiment of the present invention, the rigid substrate is a glass substrate; the sacrificial layer is a first polyimide layer; and the flexible substrate is a second polyimide layer.

In an embodiment of the present invention, a thickness of the first polyimide layer ranges from 1 micrometer to 2 micrometers.

In an embodiment of the present invention, a thickness of the second polyimide layer ranges from 8 micrometers to 10 micrometers.

In an embodiment of the present invention, a thickness of the graphene layer ranges from 30 micrometers to 50 micrometers.

In an embodiment of the present invention, the graphene layer is formed by low-temperature sputter deposition.

In an embodiment of the present invention, the display component layer has a plurality of organic light emitting diode components.

Moreover, another embodiment of the present invention provide a manufacturing method of a flexible display, including steps of:

(a) providing a carrier sequentially including a rigid substrate, a sacrificial layer and a graphene layer;

(b) forming a flexible substrate on the carrier;

(c) forming a display component layer on the flexible substrate; and (d) removing the rigid substrate and the sacrifice layer.

In an embodiment of the present invention, the rigid substrate is a glass substrate; the sacrificial layer is a first polyimide layer; and the flexible substrate is a second polyimide layer.

In an embodiment of the present invention, a thickness of the first polyimide layer ranges from 1 micrometer to 2 micrometers.

In an embodiment of the present invention, a thickness of the second polyimide layer ranges from 8 micrometers to 10 micrometers.

In an embodiment of the present invention, the step (d) further includes: applying a laser to the first polyimide layer, such that the first polyimide layer is pyrolyzed, thereby removing the rigid substrate and the sacrifice layer.

In an embodiment of the present invention, a thickness of the graphene layer ranges from 30 micrometers to 50 micrometers.

In an embodiment of the present invention, the graphene layer is formed by low-temperature sputter deposition.

In an embodiment of the present invention, the display component layer has a plurality of organic light emitting diode components.

Furthermore, yet another embodiment of the present invention provides a display structure, including:

a graphene layer;

a polyimide layer disposed on the graphene layer; and a display component layer disposed on the polyimide layer.

The method of manufacturing a display according to claim 16, wherein a thickness of the polyimide layer ranges from 8 micrometers to 10 micrometers.

In an embodiment of the present invention, a thickness of the graphene layer ranges from 30 micrometers to 50 micrometers.

In an embodiment of the present invention, the graphene layer is formed by low-temperature sputter deposition.

In an embodiment of the present invention, the display component layer has a plurality of organic light emitting diode components.

Beneficial Effect

Compared with the conventional art, the display structure and the manufacturing method of the present invention can not only solve a problem that display structures may be destroyed when a laser is used to pyrolyze a contact surface between a flexible substrate and a glass substrate, but also avoid a risk that the flexible substrate is scratched after peeling off and before transferring to a next station for bonding process, thereby preventing the scratch from adversely affecting during the subsequent bonding process, so that the product yield can be increased.

DRAWINGS

In order to make the above description of the present invention more comprehensible, the preferred embodiments are described below, and in conjunction with the accompanying drawings, the detailed description is as follows:

FIGS. 1A to 1D are schematic views of a display structure and a manufacturing method thereof according to a first embodiment of the present invention.

DETAILED DESCRIPTION OF EMBODIMENTS

The following description of the various embodiments accompanying with the drawings is provided to illustrate the specific embodiments of the present invention. Furthermore, the directional terms mentioned in the present invention, such as upper, lower, top, bottom, front, rear, left, right, inner, outer, side, surrounding, central, horizontal, lateral, vertical, longitudinal, axial, radial, uppermost or lowermost, etc., only refer to the direction of the accompanying drawings. Therefore, the directional terminology used is for the purpose of illustration and understanding of the present invention.

Please refer to FIGS. 1A-1D, in order to achieve the foregoing object of the present invention, an embodiment of the present invention provides a display structure and a manufacturing method thereof, the manufacturing method including the steps of:

(a) providing a carrier 10 sequentially including a rigid substrate 101, a sacrificial layer 102, and a graphene layer 103;

(b) forming a flexible substrate 104 on the carrier 10;

(c) forming a display component layer 105 on the flexible substrate 104;

(d) removing the rigid substrate 101 and the sacrificial layer 102.

The detailed construction, assembly relationship, and operating principle of the above-described respective elements in the embodiment will be described in detail below with reference to FIGS. 1A-1D.

Please refer to FIG. 1A, the present invention first performs the step (a) to provide the carrier 10, which is sequentially formed with the rigid substrate 101, the sacrificial layer 102, and the graphene layer 103. Preferably, the rigid substrate 101 is a glass substrate, and the sacrificial layer 102 is a first polyimide layer. Preferably, the first polyimide layer has a thickness ranging from 1 micrometer to 2 micrometers. The carrier 10 may be included the rigid substrate 101, the sacrificial layer 102, and the graphene layer 103 when a supplier provides. The carrier 10 may also be a glass substrate purchased from a supplier, and optionally, the glass substrate is cleaned in a manufacturing factory. And then, the sacrificial layer 102 is coated over the glass substrate. Optionally, the sacrificial layer 102 may also be formed on the glass substrate by a printing process. Next, a layer of the graphene layer 103 is attached on the sacrificial layer 102. Alternatively, the graphene layer 103 may also be formed by low temperature sputter deposition. Optionally, a thickness of the graphene layer 103 ranges from 30 micrometers to 50 micrometers.

Figure 1B:
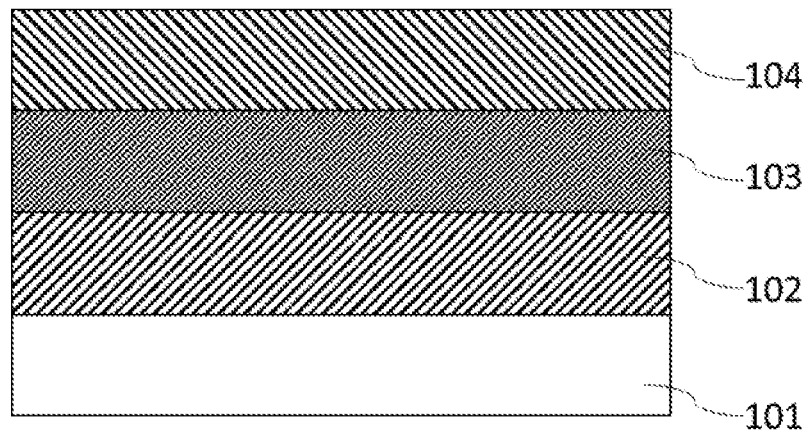
Figure 1C:
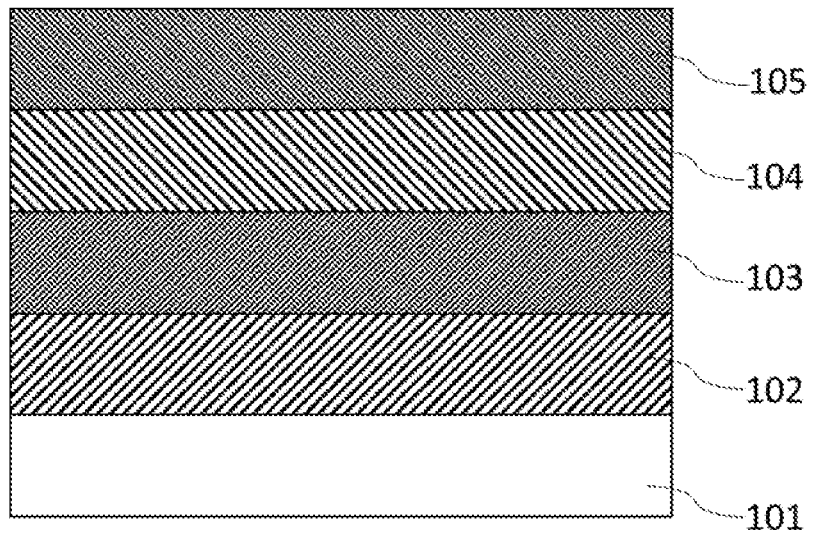

Please refer to FIG. 1B, the present invention proceeds the step (b) to form the flexible substrate 104 on the carrier 10. Preferably, the flexible substrate 104 is a second polyimide layer. Optionally, a thickness of the second polyimide layer ranges from 8 micrometers to 10 micrometers. The flexible substrate 104 may be formed on the carrier 10 by coating.

Please refer to FIG. 10, the present invention further proceeds the step (c) to form the display component layer 105 on the flexible substrate 104. Preferably, the display component layer 105 has a plurality of organic light emitting diode elements. Alternatively, the display component layer 105 may have a plurality of thin film transistors. One of ordinary skilled in the art will appreciate that the display component layer 105 may be replaced with other elements suitable for use in a flexible display. A liquid crystal layer, a color filter layer, a light filter layer or a cover plate layer may be formed on the display component layer 105, and will not be described in detail herein.

Figure 1D:
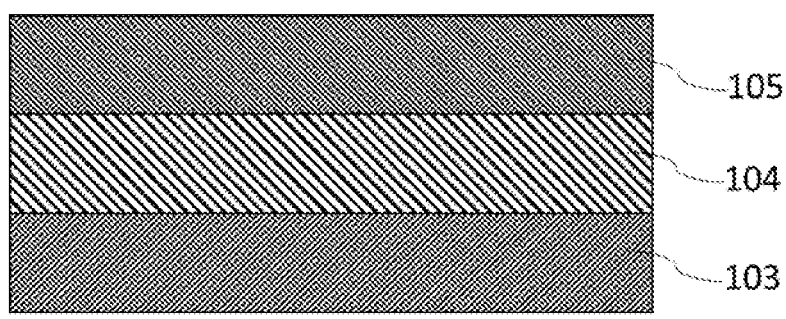

Please refer to FIG. 1D, the present invention finally proceeds the step (d) to remove the rigid substrate 101 and the sacrificial layer 102. Preferably, the step (d) further includes: applying a laser to the first polyimide layer such that the first polyimide layer is pyrolyzed, thereby removing the rigid substrate 101 and the sacrifice layer 102. When the rigid substrate 101 and the sacrificial layer 102 is removed, the graphene layer 103 may remain under the flexible substrate 104. As such, after the flexible substrate 104 is peeled off and transferred to a subsequent process, the graphene layer 103 can protect the flexible substrate 104 from the scratching risk, thereby avoiding a negative impact on the subsequent bonding process that leads to a reduction in yield. Moreover, the graphene layer 103 can effectively release the stress generated by the flexible display when the flexible display is bent, results that can improve the bendability of the flexible display. In addition, because the thickness of the first polyimide layer ranges from 1 micrometer to 2 micrometers, the first polyimide layer may be completely pyrolyzed and vaporized by the laser without remaining on the rigid substrate 101, so the rigid substrate 101 can be recycled and reused, and the first polyimide layer does not remain on the graphene layer 103, which prevents from contaminating the subsequent process and causing a decrease in yield. Furthermore, the graphene layer 103 can protect the flexible substrate 104 and the display component layer 105 which is formed on the flexible substrate 104 from damaging the flexible substrate 104 and the display component layer 105 which is formed on the flexible substrate 104 when applying the laser to the first polyimide layer. The graphene layer 103, having the thickness ranging from 30 micrometers to 50 micrometers, can effectively protect the flexible substrate 104 and the display component layer 105 formed on the flexible substrate 104 without significantly increasing the product cost, which is extremely economical.

Furthermore, another embodiment of the present invention further provides a display structure manufactured by the method described above, the display structure including:

a graphene layer;

a polyimide layer disposed on the graphene layer; and a display component layer disposed on the polyimide layer.

Preferably, the polyimide layer has a thickness ranging from 8 micrometers to 10 micrometers; and the graphene layer has a thickness ranging from 30 micrometers to 50 micrometers.

In addition, another embodiment of the present invention further provides a display carrier structure manufactured by the method described above, the display carrier structure including:

A carrier plate sequentially including a rigid substrate, a sacrificial layer and a graphene layer.

Preferably, the rigid substrate is a glass substrate, and the sacrificial layer is a first polyimide layer.

Preferably, the first polyimide layer has a thickness ranging from 1 micrometer to 2 micrometers.

Preferably, the graphene layer has a thickness ranging from 30 micrometers to 50 micrometers.

Preferably, the graphene layer is formed by low temperature sputter deposition.

As described above, compared with the existing problems, they may result that: after a flexible substrate is peeled off and before transferred to a next station, it may result a scratched risk, which may cause a negative impact during the subsequent bonding process, that leads to a reduction in yield. Moreover, using a laser to pyrolyze a contact surface between the flexible substrate and a glass substrate may damage display structures due to the high temperature of the laser. Furthermore, after the flexible substrate is pyrolyzed, a part of the flexible substrate may remain on the glass substrate, or a part of the flexible substrate may remain on the flexible substrate, that affects subsequent processes. The display structure and the manufacturing method thereof according to the present invention use a sacrificial layer and a graphene layer, so that prevent the display structures from being damaged by the laser peeling off step, and protect the flexible substrate during the manufacturing process, and increase the bendability of the flexible substrate.

The present invention has been described by the above related embodiments, but the above embodiments are merely examples for implementing the present invention. It must be noted that the described embodiments do not intend to limit the scope of the invention. Conversely, modifications and equivalent arrangements included in the spirit and scope of the claims are intended to be included within the scope of the invention.

The invention claimed is:

1. A manufacturing method of a flexible display, comprising steps of:

(a) providing a carrier sequentially including a rigid substrate, a sacrificial layer, and a graphene layer;

(b) forming a flexible substrate on the carrier;

(c) forming a display component layer on the flexible substrate; and (d) applying a laser to the sacrificial layer, such that the sacrificial layer is completely pyrolyzed and vaporized by the laser without remaining on the rigid substrate, thereby removing the rigid substrate and the sacrifice layer, wherein a thickness of the graphene layer ranges from 30 micrometers to 50 micrometers.

2. The manufacturing method of the flexible display according to claim 1, wherein the rigid substrate is a glass substrate; the sacrificial layer is a first polyimide layer; and the flexible substrate is a second polyimide layer.

3. The manufacturing method of the flexible display according to claim 2, wherein a thickness of the first polyimide layer ranges from 1 micrometer to 2 micrometers.

4. The manufacturing method of the flexible display according to claim 2, wherein a thickness of the second polyimide layer ranges from 8 micrometers to 10 micrometers.

5. The manufacturing method of the flexible display according to claim 1, wherein the graphene layer is formed by low-temperature sputter deposition.

6. The manufacturing method of the flexible display according to claim 1, wherein the display component layer has a plurality of organic light emitting diode components.

7. A manufacturing method of a flexible display, comprising steps of:

(a) providing a carrier sequentially including a rigid substrate, a sacrificial layer, and a graphene layer;

(b) forming a flexible substrate on the carrier;

(c) forming a display component layer on the flexible substrate; and (d) removing the rigid substrate and the sacrificial layer, wherein a thickness of the graphene layer ranges from 30 micrometers to 50 micrometers.

8. The manufacturing method of the flexible display according to claim 7, wherein the rigid substrate is a glass substrate; the sacrificial layer is a first polyimide layer; and the flexible substrate is a second polyimide layer.

9. The manufacturing method of the flexible display according to claim 8, wherein a thickness of the first polyimide layer ranges from 1 micrometer to 2 micrometers.

10. The manufacturing method of the flexible display according to claim 8, wherein a thickness of the second polyimide layer ranges from 8 micrometers to 10 micrometers.

11. The manufacturing method of the flexible display according to claim 8, wherein the step (d) further comprises: applying a laser to the first polyimide layer, such that the first polyimide layer is pyrolyzed, thereby removing the rigid substrate and the sacrificial layer.

12. The manufacturing method of the flexible display according to claim 7, wherein the graphene layer is formed by low-temperature sputter deposition.

13. The manufacturing method of the flexible display according to claim 7, wherein the display component layer has a plurality of organic light emitting diode components.

* * * * *